(12) United States Patent
Delano et al.

(10) Patent No.: US 8,081,785 B2
(45) Date of Patent: Dec. 20, 2011

(54) HIGH EFFICIENCY CONVERTER PROVIDING SWITCHING AMPLIFIER BIAS

(75) Inventors: Cary L. Delano, Los Altos, CA (US); William R. Chester, Morgan Hill, CA (US)

(73) Assignee: Fairchild Semiconductor Corporation, South Portland, ME (US)

(*) Notice: Subject to any disclaimer, the term of this patent is extended or adjusted under 35 U.S.C. 154(b) by 1247 days.

(21) Appl. No.: 11/688,830

(22) Filed: Mar. 20, 2007

(65) Prior Publication Data
US 2008/0019546 A1    Jan. 24, 2008

Related U.S. Application Data

(60) Provisional application No. 60/784,638, filed on Mar. 21, 2006.

(51) Int. Cl.
*H04R 5/02* (2006.01)
*H04R 25/00* (2006.01)

(52) U.S. Cl. .................... 381/300; 381/150; 381/370

(58) Field of Classification Search .................. 381/74, 381/111, 113, 120, 150, 300, 370; 330/297
See application file for complete search history.

(56) References Cited

U.S. PATENT DOCUMENTS

| | | | |
|---|---|---|---|
| 4,030,045 A | 6/1977 | Clark | |
| 4,324,950 A * | 4/1982 | Strickland | ............... 381/120 |
| 5,039,325 A | 8/1991 | Miller et al. | |
| 5,072,171 A * | 12/1991 | Eng | ...................... 323/283 |
| 5,111,375 A | 5/1992 | Marshall | |
| 5,115,203 A | 5/1992 | Krett et al. | |
| 5,194,821 A | 3/1993 | Brambilla | |
| 5,216,379 A | 6/1993 | Hamley | |
| 5,347,171 A | 9/1994 | Cordoba et al. | |
| 5,387,876 A | 2/1995 | Sondermeyer | |
| 5,442,317 A | 8/1995 | Stengel | |
| 5,491,839 A * | 2/1996 | Schotz | ...................... 455/39 |
| 5,694,072 A | 12/1997 | Hsiao et al. | |
| 6,028,486 A | 2/2000 | Andre | |
| 6,107,886 A | 8/2000 | Kusakabe | |
| 6,184,726 B1 * | 2/2001 | Haeberli et al. | ............... 327/96 |

(Continued)

FOREIGN PATENT DOCUMENTS

EP     6215356     4/2001

(Continued)

OTHER PUBLICATIONS

"U.S. Appl. No. 11/688,816, Non Final Office Action mailed Oct. 6, 2008", 6 pgs.

(Continued)

*Primary Examiner* — Curtis Kuntz
*Assistant Examiner* — Sunita Joshi
(74) *Attorney, Agent, or Firm* — Schwegman, Lundberg & Woessner, P.A.

(57) ABSTRACT

An audio amplifier system having improved power efficiency by wasting less power in its bias voltage circuit. An amplifier provides a voice signal to a first (+) input of a loudspeaker and a high efficiency converter provides a bias voltage to a second (−) input of the loudspeaker. In multi-loudspeaker systems, a single high efficiency converter can bias all the loudspeakers at a common node. The high efficiency converter can be a charge pump or a buck converter or the like, and has greater than 90% efficiency.

26 Claims, 7 Drawing Sheets

U.S. PATENT DOCUMENTS

| | | |
|---|---|---|
| 6,215,356 B1 | 4/2001 | Servaes et al. |
| 6,256,482 B1 | 7/2001 | Raab |
| 6,278,332 B1 | 8/2001 | Nelson et al. |
| 6,304,138 B1 | 10/2001 | Johnson |
| 6,323,729 B1 | 11/2001 | Sevenhans et al. |
| 6,369,661 B1 | 4/2002 | Scott et al. |
| 6,373,340 B1 | 4/2002 | Shashoua |
| 6,417,736 B1 | 7/2002 | Lewyn |
| 6,486,733 B2 | 11/2002 | Myers et al. |
| 6,504,426 B2 | 1/2003 | Picha et al. |
| 6,538,514 B2 | 3/2003 | Harvey |
| 6,552,607 B1 | 4/2003 | Danielson |
| 6,583,674 B2 | 6/2003 | Melava et al. |
| 6,614,310 B2 | 9/2003 | Quarfoot et al. |
| 6,636,103 B2 | 10/2003 | Wurcer et al. |
| 6,677,789 B1 | 1/2004 | Svard |
| 6,763,470 B1 | 7/2004 | Bell et al. |
| 6,815,988 B2 | 11/2004 | Sanduleanu |
| 6,838,942 B1 | 1/2005 | Somerville et al. |
| 6,853,244 B2 | 2/2005 | Robinson et al. |
| 6,917,245 B2 | 7/2005 | Dupuis et al. |
| 6,975,175 B2 | 12/2005 | Sanduleanu |
| 6,980,045 B1 | 12/2005 | Liu |
| 6,982,600 B2 | 1/2006 | Harvey |
| 6,987,417 B2 | 1/2006 | Winter et al. |
| 6,993,302 B2 | 1/2006 | Bausov et al. |
| 6,998,914 B2 | 2/2006 | Robinson |
| 7,026,868 B2 | 4/2006 | Robinson et al. |
| 7,034,614 B2 | 4/2006 | Robinson et al. |
| 7,042,284 B2 | 5/2006 | Moons et al. |
| 7,043,213 B2 | 5/2006 | Robinson et al. |
| 7,106,135 B2 | 9/2006 | Makino et al. |
| 7,183,844 B2 | 2/2007 | Klomsdorf et al. |
| 7,202,734 B1 | 4/2007 | Raab |
| 7,358,818 B2 | 4/2008 | Uesaka et al. |
| 7,408,414 B2 | 8/2008 | North |
| 7,498,880 B2 | 3/2009 | Delano |
| 7,522,433 B2 | 4/2009 | Delano et al. |
| 7,619,480 B2 | 11/2009 | North |
| 7,649,415 B2 | 1/2010 | Delano |
| 2002/0084853 A1 | 7/2002 | Finlay et al. |
| 2002/0140513 A1 | 10/2002 | Maneatis |
| 2003/0138112 A1 | 7/2003 | Doy |
| 2004/0189395 A1 | 9/2004 | Nagle et al. |
| 2005/0012554 A1 | 1/2005 | Somerville et al. |
| 2007/0052482 A1 | 3/2007 | Kasha et al. |
| 2007/0236295 A1 | 10/2007 | Delano |
| 2007/0285176 A1 | 12/2007 | North |
| 2008/0068079 A1 | 3/2008 | Delano |
| 2008/0258811 A1 | 10/2008 | North |
| 2008/0315955 A1 | 12/2008 | Delano |

FOREIGN PATENT DOCUMENTS

| | | |
|---|---|---|
| EP | 1120901 A1 | 8/2001 |
| JP | 63272208 A | 11/1988 |
| JP | 7240639 A | 9/1995 |
| JP | 8307223 A | 11/1996 |
| JP | 10173444 A | 6/1998 |
| JP | 11284450 A | 10/1999 |
| JP | 2000183673 A | 6/2000 |
| JP | 2002345078 A | 8/2002 |
| JP | 2002345064 A | 11/2002 |
| JP | 2004282159 A | 10/2004 |
| JP | 2004355713 A | 12/2004 |
| JP | 2004357704 A | 12/2004 |
| WO | WO 97/23005 A1 | 6/1997 |
| WO | WO 00/00983 A1 | 1/2000 |
| WO | WO-2007109738 A2 | 9/2007 |
| WO | WO-2007109738 A3 | 9/2007 |
| WO | WO-2007130750 A2 | 11/2007 |
| WO | WO-2007130750 A3 | 11/2007 |
| WO | WO-2007136919 A2 | 11/2007 |
| WO | WO-2007136919 A3 | 11/2007 |
| WO | WO-2007136920 A2 | 11/2007 |
| WO | WO-2007136920 A3 | 11/2007 |

OTHER PUBLICATIONS

"U.S. Appl. No. 11/688,822, Non Final Office Action mailed Nov. 19, 2007", 8 pgs.

"U.S. Appl. No. 11/688,822, Notice of Allowance mailed Apr. 3, 2008", 6 pgs.

"U.S. Appl. No. 11/688,822, Preliminary Amendment filed Jul. 17, 2007", 3 pgs.

"U.S. Appl. No. 11/688,822, Response filed Dec. 12, 2007 to Non Final Office Action mailed Nov. 19, 2007", 5 pgs.

"U.S. Appl. No. 11/688,826, Non Final Office Action mailed Sep. 10, 2008", 8 pgs.

"U.S. Appl. No. 11/688,826, Preliminary Amendment filed Jul. 17, 2007", 3 pgs.

"U.S. Appl. No. 11/688,835, Notice of Allowance mailed Dec. 30, 2008", 8 pgs.

"U.S. Appl. No. 11/688,833, Non Final Office Action mailed Jan. 14, 2008", 6 pgs.

"U.S. Appl. No. 11/688,833, Notice of Allowance mailed Jun. 2, 2008", 7 pgs.

"U.S. Appl. No. 11/688,833, Response filed Apr. 21, 2008 to Non Final Office Action mailed Jan. 14, 2008", 10 pgs.

"U.S. Appl. No. 12/128,092, Non Final Office Action mailed Oct. 1, 2008", 6 pgs.

"U.S. Appl. No. 12/128,092, Notice of Allowance mailed Jul. 2, 2009", 6 pgs.

"U.S. Appl. No. 12/128,092, Response filed Mar. 23, 2009 to Non Final Office Action mailed Oct. 1, 2008", 6 pgs.

"U.S. Appl. No. 12/200,794, Notice of Allowance mailed Sep. 1, 2009", 8 pgs.

"U.S. Appl. No. 12/200,794, Preliminary Amendment filed Aug. 28, 2008", 7 pgs.

"European Application Serial No. 07759038.8, Extended European Search Report Received mailed Nov. 6, 2009", 3 pgs.

"European Application Serial No. 07811828.8, Extended European Search Report Mailed on Nov. 3, 2009", 9 pgs.

"European Application Serial No. 07811829.6, Extended European Search Report Received mailed Nov. 5, 2009", 5 pgs.

"European Application Serial No. 07811829.6, Office Action Received mailed Feb. 12, 2010", 1 pgs.

"TDA7563 Multifunction Quad Power Amplifier with Built-In Diagnostics Features," May 2003. ST Microelectronics.

MAX9730 2.4W, Single-Supply, Class G Amplier, Dec. 2006, Maxim Integrated Products.

International Search Report PCT/US07/064546.

International Search Report PCT/US07/064549.

International Search Report PCT/US07/064548.

International Search Report PCT/US07/064545.

International Search Report PCT/US07/064543.

"European Application Serial No: 07811829.6, Office Action Response filed Jul. 15, 2010", 24 pgs.

"International Application Serial No. PCT/US2007/064545, International Preliminary Report on Patentability mailed Sep. 23, 2008", 6 pgs.

"International Application Serial No. PCT/US2007/064545, Written Opinion mailed Feb. 28, 2008", 5 pgs.

"International Application Serial. No. PCT/US2007/064546, International Preliminary Report on Patentability mailed May 15, 2008", 6 pgs.

"International Application Serial No. PCT/US2007/064546, Written Opinion mailed Feb. 28, 2008", 4 pgs.

"International Application Serial No. PCT/US2007/064548, International Preliminary Report on Patentability mailed Sep. 23, 2008", 8 pgs.

"International Application Serial No. PCT/US2007/064548, Written Opinion mailed Mar. 19, 2008", 7 pgs.

"International Application Serial No. PCT/US2007/064549, Written Opinion mailed Feb. 22, 2008", 4 pgs.

"U.S. Appl. No. 11/688,829, Response filed Jul. 14, 2011 to Final Office Action mailed Apr. 14, 2011", 11 pgs.

"Japanese Application Serial No. 2009-501719, Office Action mailed May 10, 2011", 9 pgs.

"Japanese Application Serial No. 2009-501721, Office Action mailed Jun. 7, 2011", 7 pgs.

"Japanese Application Serial No. 2009-501720, Office Action mailed May 10, 2011", 11 pgs.

"U.S. Appl. No. 11/688,829, Final Office Action mailed Apr. 14, 2011", 25 pgs.

"U.S. Appl. No. 11/688,829, Non Final Office Action mailed Nov. 26, 2010", 24 pgs.

"U.S. Appl. No. 11/688,829, Response filed Mar. 28, 2011 to Non Final Office Action mailed Nov. 26, 2010", 11 pgs.

* cited by examiner

HIGH EFFICIENCY CONVERTER PROVIDING SWITCHING AMPLIFIER BIAS

RELATED APPLICATION

The present application claims benefit under 35 USC 119 (e) of U.S. provisional Application No. 60/784,638, filed on Mar. 21, 2006, entitled "Adaptive Biasing Based on Volume Control Setting," the content of which is incorporated herein by reference in its entirety.

BACKGROUND OF THE INVENTION

1. Technical Field of the Invention

This invention relates generally to audio amplifiers, and more specifically to an improvement in power efficiency in apparatus for driving a common load terminal bias in a stereo transducer system (a configuration common in headphone amplifiers where standard jacks tie both speaker commons together).

2. Background Art

An audio loudspeaker includes a pair of electrical input terminals, conventionally identified as the + terminal and the − terminal (also referred to as the common terminal or the ground terminal). The loudspeaker is driven with a zero average alternating current voice signal from an amplifier which is coupled to the terminals. In order to avoid having a DC offset over time, the + terminal is alternatingly provided with a voltage which is positive and then negative with respect to the − terminal. In some systems, the − terminal is held at a 0v ground potential, and the + terminal is fed a signal that, for example, swings between a maximum of +5v and a minimum of −5v. In other systems, the + signal swings between e.g. a maximum of +10v and a minimum of 0v, and the − terminal is held at 5v. Or, more precisely, the − terminal is held at Vcc/2, where Vcc is the maximum voltage that could be applied at the + terminal. In either case, the voltage at which the − terminal is held may be referred to as a "bias voltage".

In most portable music systems with headphones, the − terminals of the left and right loudspeakers (e.g. headphones or ear buds) are coupled together at a common node, and the + and − terminals have very large ac coupling capacitors in series with them to drop VCC/2 of voltage. The − terminal is then tied to 0V. These coupling capacitors are very large and expensive, both of which are undesirable traits. An alternating solution that has been used is to tie the common − terminals together and to apply the VCC/2 or other bias voltage at this common node. In either configuration, the left and right loudspeakers' + inputs are then driven with the left and right voice signals, respectively.

A variety of circuit schemes have been used to generate the common bias voltage.

Figure 1:
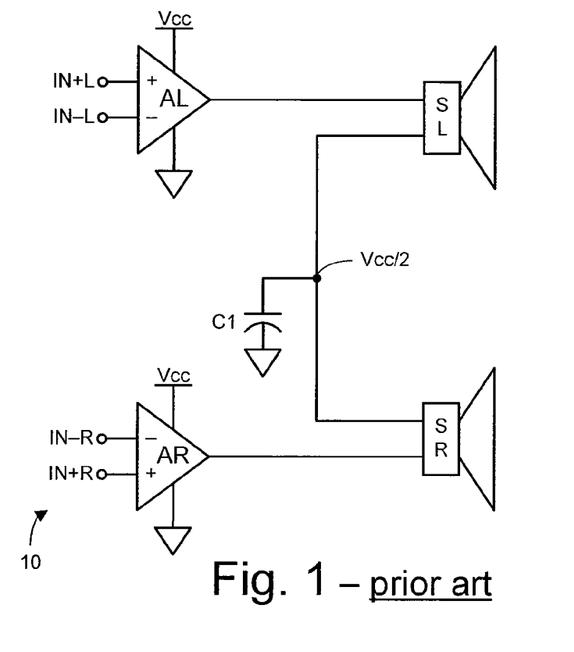
FIG. 1 shows an audio system including one bias voltage circuit scheme according to the prior art, using a simple capacitor to provide the bias voltage.

FIG. 1 illustrates an audio system 10 using a very simple common bias voltage scheme. The audio system includes a left loudspeaker SL and a right loudspeaker SR. The audio system includes a left amplifier AL which drives the left speaker and a right amplifier AR which drives the right amplifier. The − terminals of the loudspeakers are coupled together at a common node, and a suitably sized capacitor C1 is coupled between the common node and ground.

This system is power efficient but, unfortunately, requires a large, expensive capacitor. The capacitor is a high-pass filter with regard to the residual signal left across the speaker terminals; if the capacitor is too small, it will cut off audible low frequencies, preventing them from reaching the loudspeakers.

Figure 2:
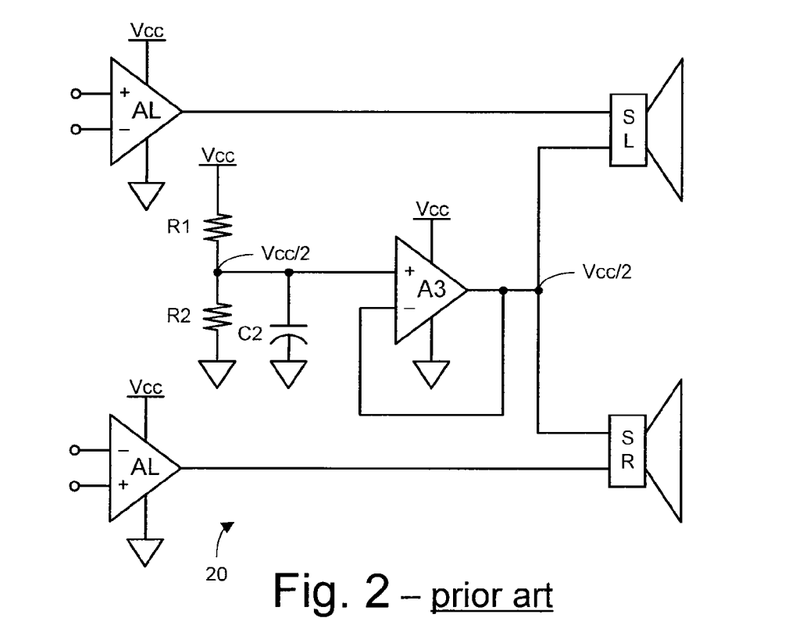
FIG. 2 shows an audio system including another bias voltage circuit scheme according to the prior art, using an op-amp to provide the bias voltage.

FIG. 2 illustrates an audio system 20 using a third amplifier A3 to provide the bias voltage at the common node. The + input of the third amplifier is tied to a voltage divider which includes matched resistors R1 and R2 coupled in series between Vcc and ground, with a capacitor C2 coupled from the voltage divider to ground to remove noise from the voltage divider. The third amplifier is coupled in negative feedback fashion, as shown.

This system requires only a small (and optional) capacitor, rather than the large capacitor of FIG. 1. Unfortunately, the voltage divider and the third amplifier consume non-trivial amounts of power, significantly reducing the overall power efficiency of the amplifier section of the system.

Figure 3:
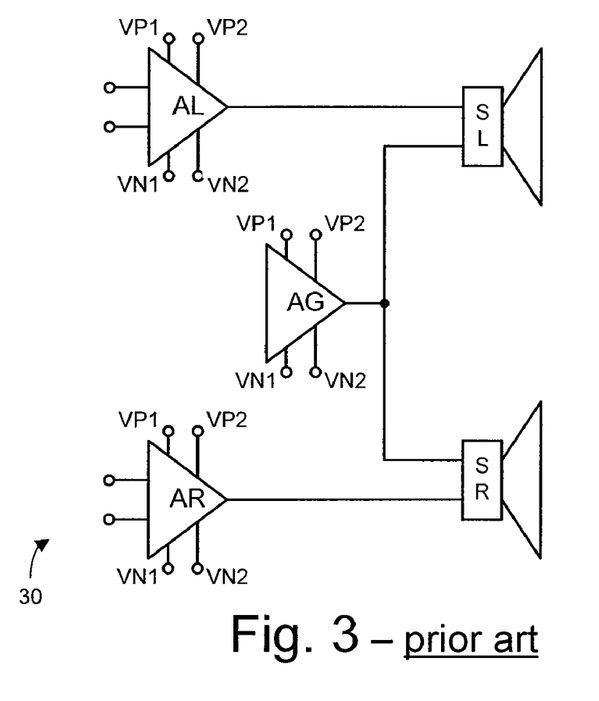
FIG. 3 shows an audio system including yet another bias voltage circuit scheme according to the prior art, using a Class G op-amp to provide the bias voltage.

FIG. 3 illustrates a similar audio system 30 using Class G amplifiers. Unlike Class A, B, and AB amplifiers, which are single supply meaning that only a single pair of power rails (Vcc and ground) are provided to them, Class G amplifiers have two or more pairs of power rails, between which they switch, depending on the instantaneous voltage level of the input signal. The designer may elect to use Class G amplifiers, to minimize power wasted in the amplifier section of the system.

As shown, a Class G amplifier AG can be used to provide the bias voltage at the common node. This is independent of whether the left and right power amplifiers are also Class G. With the output of the third amplifier being very stable at Vcc/2, the third amplifier will typically be operating with its closest-to-center voltage rail pair selected, minimizing its power consumption.

Unfortunately, its power consumption will still be non-trivial, even with a stable Vcc/2 output.

What is needed is an improved amplifier section which uses an even lower-power circuit for providing the bias voltage at the loudspeakers' common node.

Figure 4:
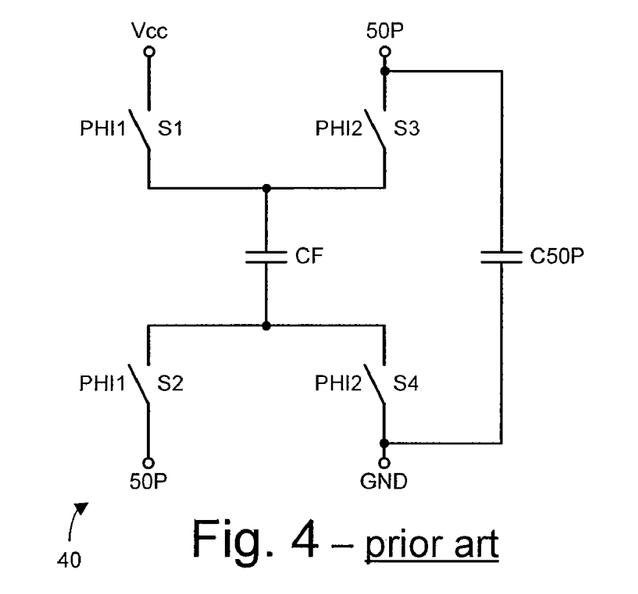
FIG. 4 shows a charge pump according to the prior art.

FIG. 4 illustrates a high efficiency charge pump circuit 40 which is known in analog and power semiconductor design. The charge pump is built around a flying capacitor CF and a switching device. The switching device has a first switch S1 coupled to Vcc and controlled by a first switch input signal PHI1, a second switch S2 controlled by the first switch input signal, a third switch S3 controlled by a second switch input signal PHI2, and a fourth switch S4 coupled to ground and controlled by the second switch input signal. The inputs of the second and third switches are coupled to an output node 50P. A second capacitor C50P is coupled between the output node and ground. When the first and second switch control signals are operated correctly (typically as binary clock signals 180° out of phase, with non-overlapping clocks), Vcc/2 is generated at the output node.

The charge pump is one example of a high efficiency converter. Another example is an inductive switching supply such as a buck converter, which is very well known in the art of power semiconductor design.

DETAILED DESCRIPTION

The invention will be understood more fully from the detailed description given below and from the accompanying drawings of embodiments of the invention which, however, should not be taken to limit the invention to the specific embodiments described, but are for explanation and understanding only.

Figure 5:
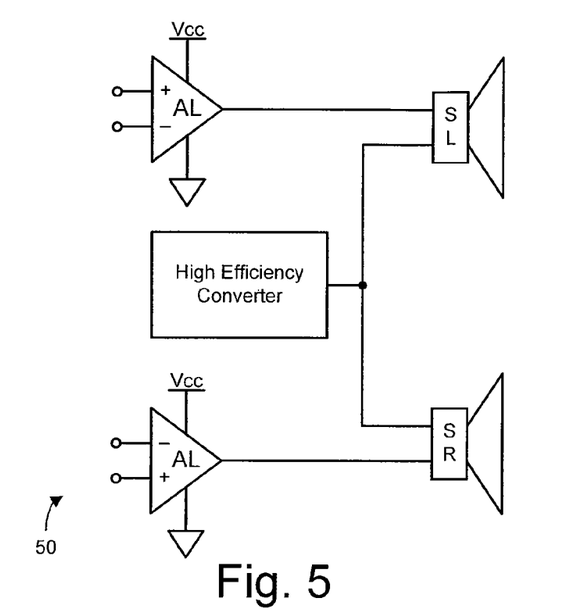
FIG. 5 shows an audio system including a high efficiency converter for providing the bias voltage, according to one embodiment of this invention.

FIG. 5 illustrates an audio system 50 according to one embodiment of this invention. The audio system includes a left loudspeaker SL driven by a left amplifier AL, and a right loudspeaker SR driven by a right amplifier AR. The − terminals of the loudspeakers are coupled together at a common node. A high efficiency converter is coupled to provide the bias voltage at this common node. In one embodiment, the high efficiency converter is a charge pump. In another embodiment, it is an inductive converter such as a buck converter.

High efficiency converters have power efficiency which is typically above 90%, and can exceed 95% in some cases. By using a high efficiency converter, rather than an expensive capacitor or a power hungry third amplifier, the BOM cost and/or overall power efficiency of the system is significantly improved and the overall cost and/or power consumption of the system is significantly reduced.

And, furthermore, a single high efficiency converter can be used to provide the bias voltage to each of two, three, four, or more audio channels, further amortizing the already small power cost of the high efficiency converter.

Figure 6:
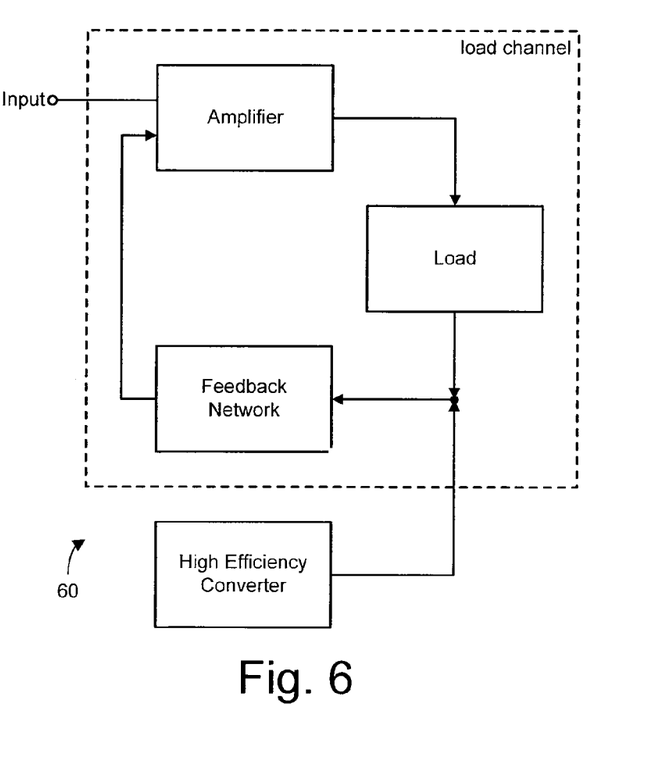
FIG. 6 shows an electronic system using a high efficiency converter for providing a bias voltage, according to another embodiment of this invention.

FIG. 6 illustrates an electronic system 60 including a high efficiency converter coupled to provide a bias voltage to a load channel including an amplifier, a load, and a feedback network. In one embodiment, the load is a loudspeaker. The feedback network reduces errors across the load which result from finite output impedance, non-linearities, and noise of the high efficiency converter.

Figure 7:
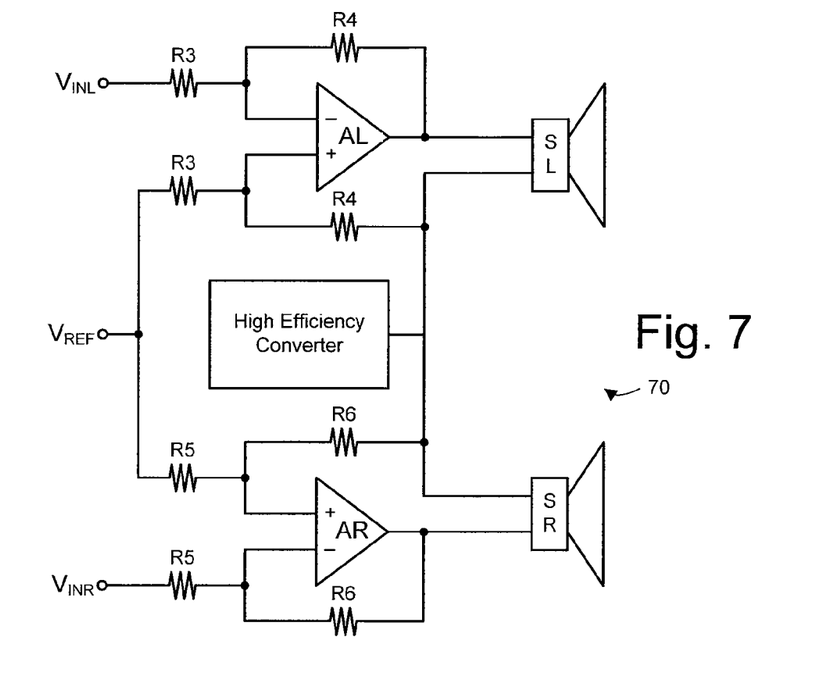
FIG. 7 shows an audio system including a high efficiency converter, according to another embodiment of this invention.

FIG. 7 illustrates an audio system 70 including a high efficiency converter coupled to provide a bias voltage to two load channels, each including a loudspeaker, a differential amplifier, and a feedback network. Two sets of feedback resistors are used in each channel. The resistors coupled to the inverting (−) input set the forward gain of the amplifier, and the resistors coupled to the non-inverting (+) input control the amount of correction that occurs across the loudspeaker.

For example, the voltage on the output of the high efficiency converter appears at the + terminal of op amp AL with a dividing ratio of R3/(R3+R4). The gain from this node to the output of op amp AL is 1+(R4/R3). Thus, the net gain from the output of the high efficiency converter to the output of op amp AL is (R3/(R3+R4))*(1+R4/R3), which is equal to 1. This means that any undesired signal on the output of the high efficiency converter also appears on the output of AL with unity gain. The differential voltage across speaker SL is therefore 1−1=0, which means that the undesired artifacts on the output of the high efficiency converter (e.g. crosstalk, noise, distortion, etc.) are eliminated. Similarly, by the feedback associated with R5 and R6, the artifacts are eliminated across speaker SR by op amp AR. It should be noted that positive feedback is used to achieve this result and concerns of stability need to be discussed. The voltage that appears on the output of AL is attenuated on the output of the high efficiency converter, which means that the net loop gain is less than unity. This ultimately means that the loop is stable.

The left amplifier is fed a left audio channel voice signal $V_{INL}$ and the right amplifier is fed a right audio channel voice signal $V_{INR}$ from an audio source. The non-inverting inputs of the amplifiers are coupled, through the resistors shown, with a $V_{REF}$ signal which is Vdd/2 or some other low noise reference voltage.

Figure 8:
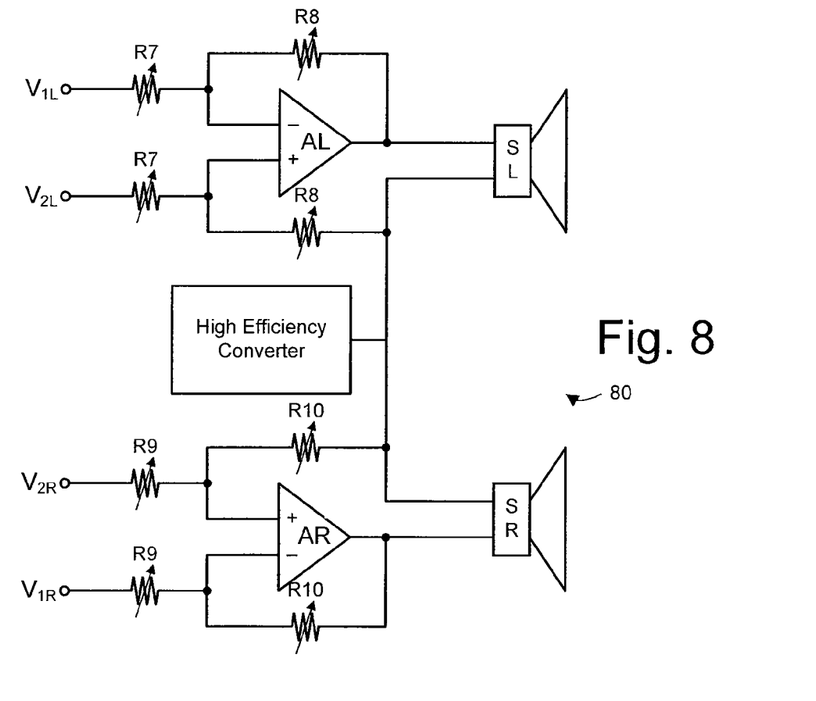
FIG. 8 shows an audio system including a high efficiency converter, according to another embodiment of this invention, in which variable resistors are employed.

FIG. 8 illustrates another audio system 80 similar to that of FIG. 7, but using variable resistors at the inverting input side of the amplifier to provide variable gain capability. By using variable resistors in the non-inverting side as well, variable error correction feedback is provided, to reduce errors across the loudspeaker at all gain settings. This is important, because the final amplifier stage is often integrated with volume controls or programmable or adjustable gain levels.

An inverting gain configuration is achieved when $V_{1L}$ and $V_{1R}$ are used as the voice signal inputs and $V_{2L}$ and $V_{2R}$ are used as the reference. A non-inverting gain configuration is achieved when $V_{2L}$ and $V_{2R}$ are used as the voice signal inputs and $V_{1L}$ and $V_{1R}$ are used as the reference. And a differential input configuration is achieved when $V_{2L}$ and $V_{2R}$ are used as the positive inputs and $V_{1L}$ and $V_{1R}$ are used as the negative inputs. The circuit of FIG. 7 could also be wired in this manner, rather than having a common $V_{REF}$ input node.

Figure 9:
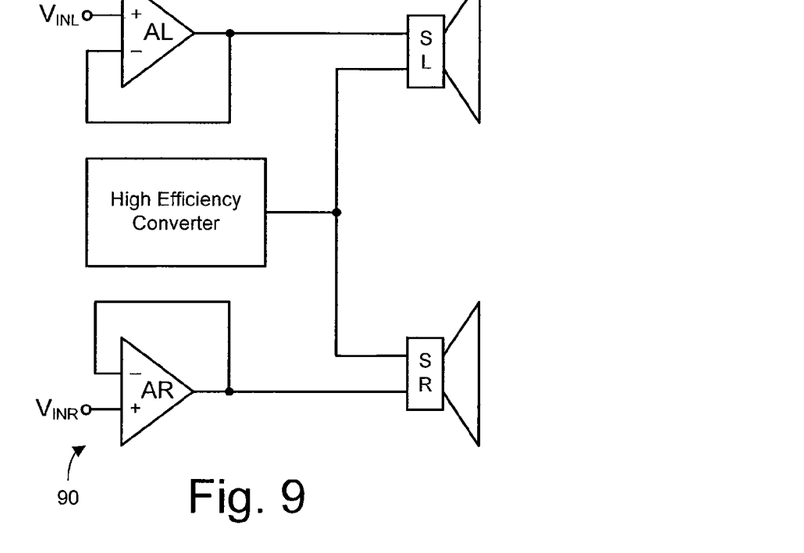
FIG. 9 shows an audio system including a high efficiency converter, according to another embodiment of this invention.

FIG. 9 illustrates an audio system 90 in which the amplifiers are configured as unity gain buffers, with a high efficiency converter generating the bias voltage for both channels.

Figure 10:
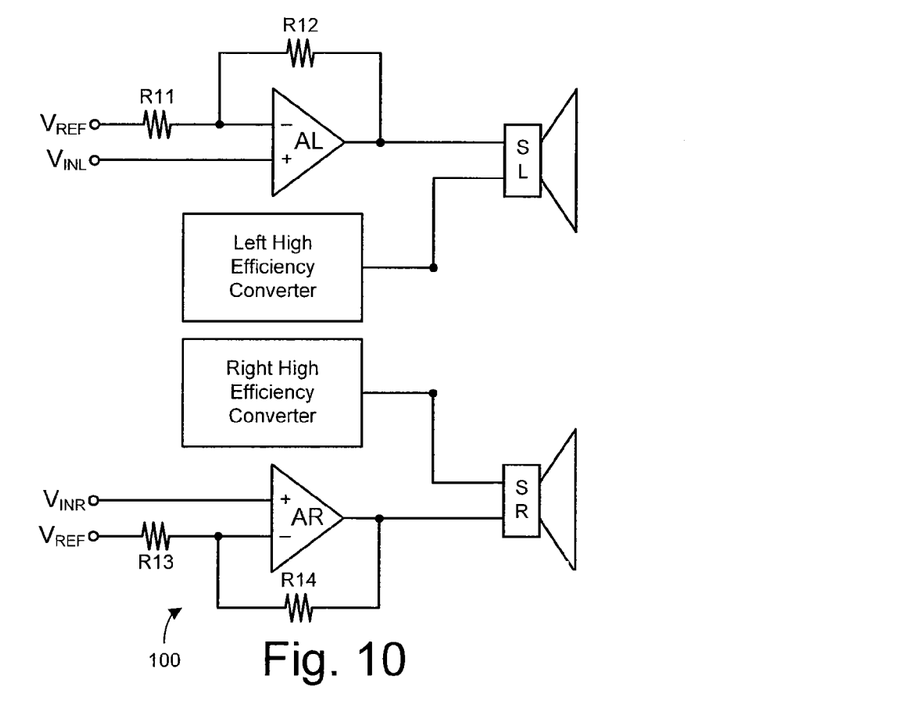
FIG. 10 shows an audio system including separate high efficiency converters for each audio channel, according to another embodiment of this invention.

FIG. 10 illustrates an audio system 100 in which the amplifiers are wired in a positive gain configuration, with separate high efficiency converters for each channel. There may be applications in which it is desirable that all the audio channels not share a single, common high efficiency converter. For example, in a 5.1 or 7.1 channel home theater system, it may in some instances be desirable that the LCR channels have a first common bias provided by one high efficiency converter, the surround channels have a second common bias provided by another high efficiency converter, and the subwoofer channel have a third bias provided by yet another high efficiency converter.

Figure 11:
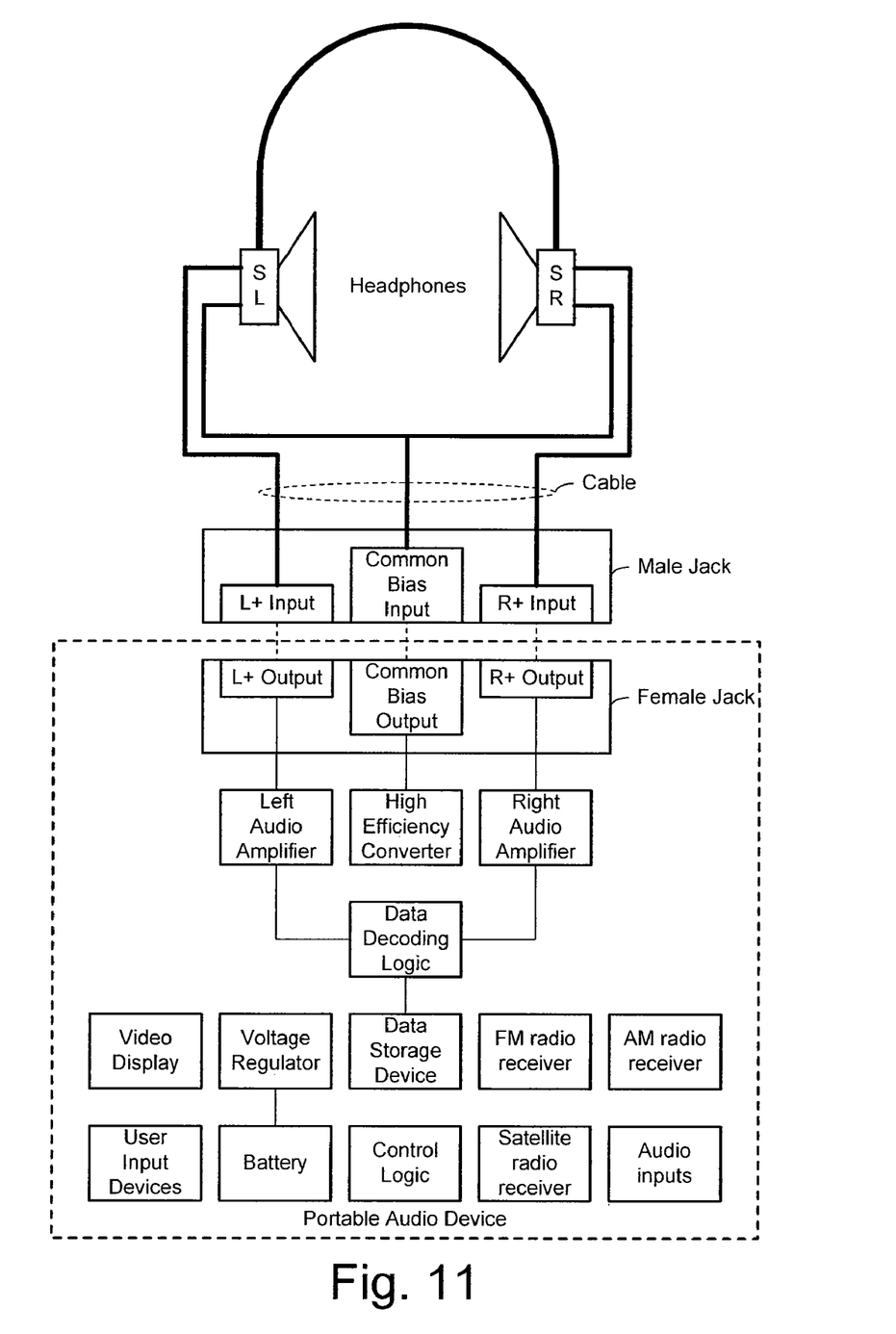
FIG. 11 shows a portable audio player incorporating the electronics of this invention.

FIG. 11 illustrates a portable audio device constructed with the electronics of this invention. The portable audio device is adapted for use with a conventional pair of stereo headphones, which includes a left electroacoustic transducer SL and a right electroacoustic transducer SR. The transducers may be electromagnetic, electrostatic, piezoelectric, or other suitable type.

The portable audio device includes data storage such as flash memory for storing data in which is encoded, in any manner whatsoever, any variety of audio and/or audio/video content. The portable audio device includes data decoding logic, whether implemented in hardware and/or software, for decoding that content; the logic includes appropriate digital to analog conversion circuitry for converting the decoded content into an analog voice signal. The portable audio device includes a high efficiency converter as described above, and one or more audio amplifiers coupled to receive respective audio channel signals from the data decoding logic; in the example shown, these include a left audio amplifier and a right audio amplifier, but other implementations may have mono, quad, 5.1, 7.1, or other channel configurations.

The portable audio device includes one or more user input devices such as buttons and dials for operating menus and controlling the volume and so forth, and control logic for governing the operation of the portable audio device. It may optionally also include a video output device, radio receivers for FM, AM, and/or satellite radio signals, and audio inputs for receiving audio content from external sources.

The portable audio device includes a female jack at which the audio amplifiers present their audio signals and the high efficiency converter presents its bias voltage. The female jack mates with the headphones' male jack, to couple these signals to their proper transducer inputs via a cable of suitable length.

The portable audio device includes a power source such as a battery, a fuel cell, or what have you. If the power source is unable to produce the correct power rails for the audio amplifiers, the high efficiency converter, the data storage device, the data decoding logic, the radio receivers, etc., it may also include a voltage regulator which steps the battery's output up and/or down to create the appropriate power rails needed by the various devices.

In one embodiment, the headphones are a detachable component which may be sold separately from the portable audio device. In another embodiment, the headphones are permanently coupled to the portable audio device. In yet another embodiment, the portable audio device is built into the headphones themselves, rather than being in a separately housed device.

Figure 12:
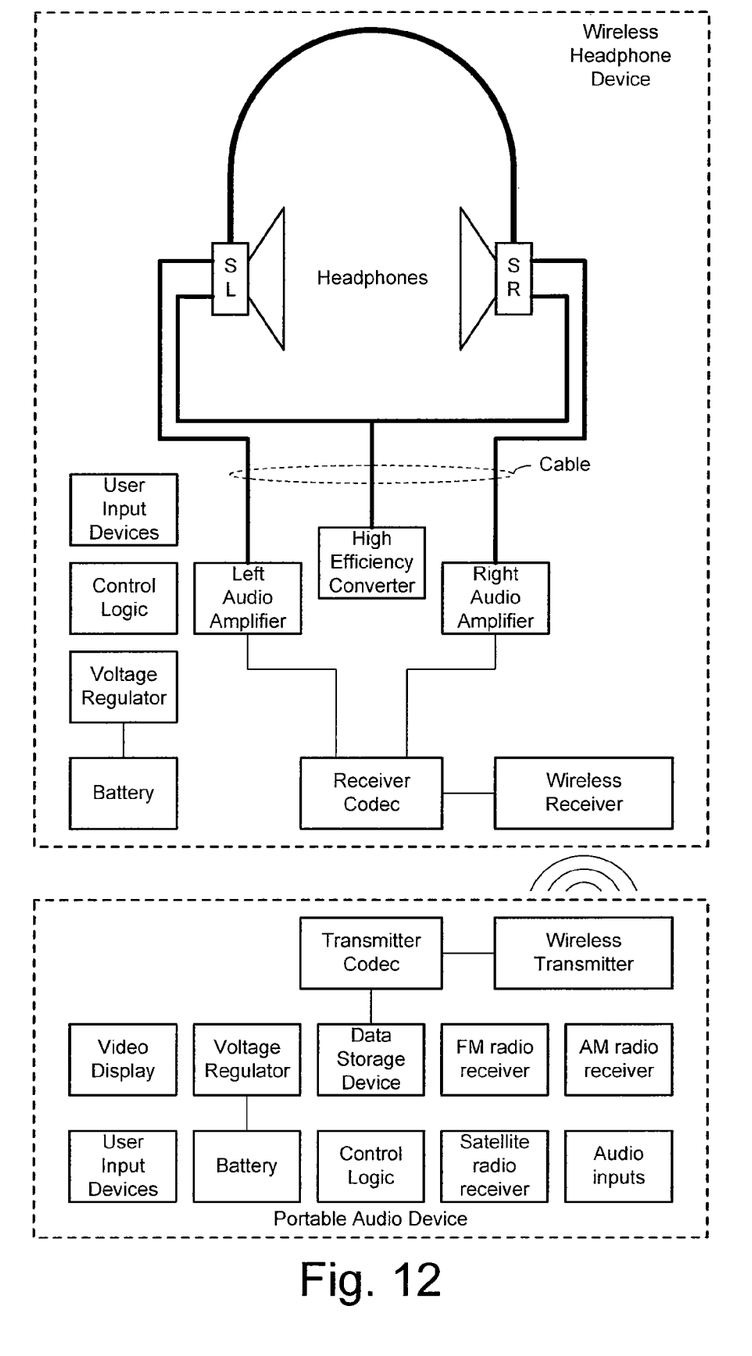
FIG. 12 shows another portable audio player incorporating the electronics of this invention.

FIG. 12 illustrates another embodiment in which the invention is built into the headphone device, but the headphone device is not a complete system. Rather, the headphone device includes a wireless receiver for receiving audio data via any suitable wireless signal, such as a Bluetooth signal, an FM modulated signal, an infrared signal, a WiFi signal, a cellular signal, or what have you, and a suitable receiver codec for decoding the received data. The wireless headphone device includes its own power supply such as a battery, its own control logic, its own user input devices, and so forth.

The wireless data are received from any suitable source. In the example shown, it is received from a portable audio device carried by or near the user. In other embodiments, the wireless data could be transmitted by a source which broadcasts to a multitude of wireless headphone devices.

The audio amplifiers and the high efficiency converter are part of the wireless headphone device. The audio amplifiers receive their input signals from the receiver codec, as shown, after appropriate digital to analog conversion. The audio amplifiers may be, for example Class D amplifiers.

CONCLUSION

When one component is said to be "adjacent" another component, it should not be interpreted to mean that there is absolutely nothing between the two components, only that they are in the order indicated.

The various features illustrated in the figures may be combined in many ways, and should not be interpreted as though limited to the specific embodiments in which they were explained and shown.

Although in various drawings there are specific numbers of channels actually illustrated, the invention may be practiced with any number of channels, each having their own load and their own amplifier.

Those skilled in the art, having the benefit of this disclosure, will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. An amplifier system for use with a signal source, at least one pair of power rails, and a load, the load having a first signal input and a second signal input, the amplifier system comprising:
    a first amplifier having,
        at least one pair of power inputs for coupling to a respective pair of the power rails,
        a first signal input for coupling to the signal source,
        a second signal input, and
        an output for coupling to the first signal input of the load; and
    a high efficiency converter having,
        at least one pair of power inputs for coupling to a respective pair of the power rails,
        a bias voltage output for coupling to the second signal input of the load, and
        a circuit coupled to the power inputs and to the bias voltage output for generating a bias voltage at the second signal input of the load.

2. The amplifier system of claim 1 wherein the high efficiency converter comprises:
    a charge pump.

3. The amplifier system of claim 2 wherein the charge pump comprises:
    a flying capacitor;
    a switch mechanism coupled to the flying capacitor and having at least four switches, wherein two of the switches are coupled to the power inputs of the high efficiency converter.

4. The amplifier system of claim 1 wherein the load is a first electroacoustic transducer and wherein:
    the first amplifier comprises a first audio amplifier.

5. The amplifier system of claim 4 further for use with a second electroacoustic transducer, and further comprising:
    a second amplifier having,
        at least one pair of power inputs for coupling to a respective pair of the power rails,
        a first signal input for coupling to the signal source,
        a second signal input, and
        an output for coupling to a first signal input of the second electroacoustic transducer;
    wherein the bias voltage output of the high efficiency converter is further for coupling to a second signal input of the second electroacoustic transducer.

6. The amplifier system of claim 1 further comprising:
    a feedback network coupled from the load to the amplifier.

7. The amplifier system of claim 1 wherein:
    the high efficiency converter has an efficiency greater than 80%.

8. The amplifier system of claim 1 wherein:
the high efficiency converter has an efficiency greater than 90%.

9. The amplifier system of claim 1 wherein:
the high efficiency converter has an efficiency greater than 95%.

10. A stereo audio amplifier system for use with a source, a left loudspeaker, and a right loudspeaker, the amplifier system comprising:
(1) a left channel audio amplifier having,
a left channel audio signal input for coupling to receive a left channel audio input signal from the source,
left amplifier circuitry for amplifying the left channel audio input signal input, and
a left channel output for coupling to provide the amplified left channel audio input signal at a first input of the left loudspeaker;
(2) a right channel audio amplifier having,
a right channel audio signal input for coupling to receive a right channel audio input signal from the source,
right amplifier circuitry for amplifying the right channel audio input signal input, and
a right channel output for coupling to provide the amplified right channel audio input signal at a first input of the right loudspeaker; and
(3) a high efficiency converter including,
a bias output for coupling to a second input of at least one of the loudspeakers, and
circuitry for generating a bias voltage at the bias output, wherein the high efficiency converter is at least 80% efficient.

11. The amplifier system of claim 10 wherein:
the bias output is further for coupling to a second input of each of the loudspeakers;
such that both loudspeakers are biased by a single high efficiency converter.

12. The amplifier system of claim 10 wherein the high efficiency converter comprises:
a charge pump.

13. The amplifier system of claim 10 wherein:
the bias output of the high efficiency converter is for coupling to a second input of the left loudspeaker; and further comprising
a second high efficiency converter including,
a bias output for coupling to a second input of the right loudspeaker, and
circuitry for generating a bias voltage at the bias output of the second high efficiency converter,
wherein the second high efficiency converter is at least 80% efficient.

14. The amplifier system of claim 13 wherein:
each of the high efficiency converters is at least 90% efficient.

15. The amplifier system of claim 13 wherein each of the high efficiency converters comprises:
a charge pump.

16. The amplifier system of claim 10 wherein:
the high efficiency converter is at least 90% efficient.

17. The amplifier system of claim 10 further comprising:
a left feedback network coupled to the left channel audio amplifier; and
a right feedback network coupled to the right channel audio amplifier.

18. The amplifier system of claim 10 wherein:
each of the audio amplifiers is wired in an inverting gain configuration.

19. The amplifier system of claim 10 wherein:
each of the audio amplifiers is wired in a non-inverting gain configuration.

20. The amplifier system of claim 10 wherein:
each of the audio amplifiers is wired in a differential input configuration.

21. The amplifier system of claim 10 wherein:
each of the audio amplifiers provides maximum voltage of Vcc at its loudspeaker's first input; and
the high efficiency converter provides a bias voltage of substantially Vcc/2.

22. A portable electronic audio player comprising:
a power source;
at least one electroacoustic transducer;
at least one audio amplifier coupled to the power source and coupled to receive an analog voice signal and to provide an amplified audio signal to a first input of a respective electroacoustic transducer;
a high efficiency converter coupled to the power source and coupled to provide a bias signal to a second input of the at least one electroacoustic transducer.

23. The portable electronic audio player of claim 22 further comprising:
a data storage device for storing data containing audio content; and
data decoding logic coupled to the data storage device for decoding the audio content data and for generating from the decoded audio content data the analog voice signal.

24. The portable electronic audio player of claim 22 further comprising:
a radio receiver coupled to at least one of the data decoding logic and the audio amplifier.

25. The portable electronic audio player of claim 22 wherein:
the at least one electroacoustic transducer comprises stereo headphones; and
the at least one audio amplifier comprises left and right audio amplifiers.

26. The portable electronic audio player of claim 25 further comprising:
a wireless receiver for receiving data containing audio content;
a receiver codec coupled the wireless receiver and to the left and right audio amplifiers to convert the audio content into analog voice signals.

* * * * *